United States Patent
Rofougaran et al.

(10) Patent No.: US 8,369,889 B2
(45) Date of Patent: *Feb. 5, 2013

(54) METHOD AND SYSTEM FOR SHARING A SINGLE ANTENNA FOR FREQUENCY MODULATION (FM) TRANSMISSION, FM RECEPTION AND NEAR FIELD COMMUNICATION (NFC)

(75) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 899 days.

This patent is subject to a terminal disclaimer.

(21) Appl. No.: 11/753,698

(22) Filed: May 25, 2007

(65) Prior Publication Data

US 2008/0233880 A1 Sep. 25, 2008

Related U.S. Application Data

(60) Provisional application No. 60/895,698, filed on Mar. 19, 2007.

(51) Int. Cl.
*H04M 1/00* (2006.01)

(52) U.S. Cl. .......... 455/552.1; 455/41.2; 455/185.1; 455/78; 455/82; 340/10.1

(58) Field of Classification Search ............. 340/10.1, 340/572.1, 5.53; 455/552.1, 41.2, 185.1, 455/78, 82, 102
See application file for complete search history.

(56) References Cited

U.S. PATENT DOCUMENTS

| | | | |
|---|---|---|---|
| 6,609,010 B1 * | 8/2003 | Dolle et al. | 455/552.1 |
| 7,342,497 B2 * | 3/2008 | Chung et al. | 340/572.1 |
| 2002/0008588 A1 * | 1/2002 | Khan | 331/18 |
| 2002/0126013 A1 * | 9/2002 | Bridgelall | 340/572.1 |
| 2004/0116074 A1 * | 6/2004 | Fujii et al. | 455/41.2 |
| 2005/0003785 A1 * | 1/2005 | Jackson et al. | 455/260 |
| 2006/0072647 A1 * | 4/2006 | Feher | 375/130 |
| 2007/0030116 A1 * | 2/2007 | Feher | 340/5.53 |
| 2008/0180220 A1 * | 7/2008 | Hollister et al. | 340/10.2 |

* cited by examiner

*Primary Examiner* — Anthony Addy
*Assistant Examiner* — Shahriar Behnamian
(74) *Attorney, Agent, or Firm* — Farjami & Farjami LLP

(57) ABSTRACT

Aspects of a method and system for sharing a single antenna for frequency modulation (FM) transmission, FM reception and near field communication (NFC) are presented. Aspects of a system may include at least one circuit that enables, via a single antenna, simultaneous transmission of an FM signal and reception of an FM signal, and transmission of an NFC signal or reception of an NFC signal.

22 Claims, 4 Drawing Sheets

METHOD AND SYSTEM FOR SHARING A SINGLE ANTENNA FOR FREQUENCY MODULATION (FM) TRANSMISSION, FM RECEPTION AND NEAR FIELD COMMUNICATION (NFC)

CROSS-REFERENCE TO RELATED APPLICATIONS/INCORPORATION BY REFERENCE

This application makes reference to, claims priority to, and claims the benefit of U.S. Provisional Application Ser. No. 60/895,698 filed Mar. 19, 2007, which is hereby incorporated herein by reference in its entirety.

FIELD OF THE INVENTION

Certain embodiments of the invention relate to wireless communication. More specifically, certain embodiments of the invention relate to a method and system for sharing a single antenna for frequency modulation (FM) transmission, FM reception and near field communication (NFC).

BACKGROUND OF THE INVENTION

As portable electronic devices and wireless devices become more popular, an increasing range of mobility applications and services are emerging. There are well established broadcast and communication services, which utilize the frequency modulation (FM) frequency band. In addition, there are other communication services, which utilize other frequency bands. Near field communication (NFC) is a communication standard that enables wireless communication devices, such as cellular telephones, SmartPhones, and personal digital assistants (PDAs) to establish peer-to-peer (P2P) networks. NFC may enable electronic devices to exchange data and/or initiate applications automatically when they are brought in close proximity, for example ranging from touching, or 0 cm, to a distance of about 20 cm.

NFC may enable downloading of images stored in a digital camera, to a personal computer, or downloading of audio and/or video entertainment to MP3 devices, or downloading of data stored in a SmartPhone to a personal computer, or other wireless device, for example. NFC may be compatible with smart card technologies and may also be utilized to enable purchase of goods and services. RFID applications and NFC applications may utilize a common RF band.

However, integrating the disparate mobility applications and services into a single device may be costly. Some conventional portable electronic device, for example, may utilize separate antennas, hardware, and/or software for the reception, transmission, and/or processing of signals associated with the various mobility applications and services.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A method and system for sharing a single antenna for frequency modulation (FM) transmission, FM reception and near field communication (NFC), substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for sharing a single antenna for frequency modulation (FM) transmission, FM reception and near field communication (NFC). Various embodiments of the invention comprise a method and system in which an FM transmitter (TX) and an NFC transceiver may simultaneously transmit signals via a single antenna. In another aspect of these various embodiments of the invention, the single antenna may also be utilized for simultaneous reception of FM and NFC signals. The received FM signal may be sent to an FM receiver (RX) and the received NFC signal may be sent to the NFC transceiver. Various embodiments of the invention may also comprise combinations of FM transceiver, NFC RX and NFC TX circuitry.

Aspects of a system for utilizing an FM antenna for NFC and RFID may comprise configuring an antenna to receive signals in the FM frequency band, or to receive signals in the NFC frequency band. An exemplary FM frequency band utilized in most of the world may comprise a range of frequencies from about 87.5 MHz to about 108 MHz. An exemplary frequency utilized for NFC signals is about 13.5 MHz.

Figure 1:
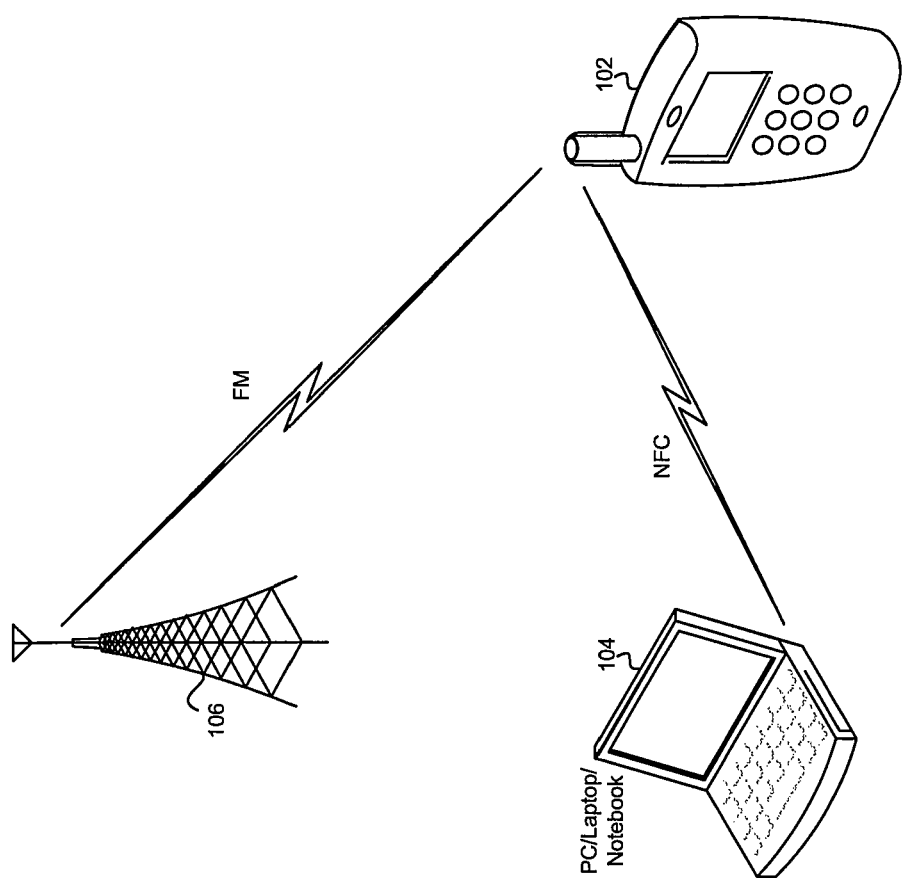
FIG. 1 is a diagram illustrating exemplary FM and NFC communication, which may be utilized in connection with an embodiment of the invention.

FIG. 1 is a diagram illustrating exemplary FM and NFC communication, which may be utilized in connection with an embodiment of the invention. Referring to FIG. 1, there is shown a wireless communication device 102, a personal computer (PC) 104 and an antenna tower 106. In an exemplary embodiment of the invention, the wireless communication device 102 and PC 104 may communicate via signals within the NFC frequency band, while the wireless communication device 102 and antenna tower 106 may communicate via signals within the FM frequency band. Various embodiments of the invention may be practiced in a wide range of wireless communication devices, which may utilize FM and NFC communication via a single antenna. For example, in another exemplary embodiment of the invention, the PC 104 may utilize a single antenna to enable FM and NFC communication.

When a device, such as the wireless communication device 102, attempts to transmit data via signals within the NFC frequency band, it may generate an electromagnetic field within its proximate vicinity. The PC 104 may detect corresponding electromagnetic energy, which may cause initiation of an NFC peer-to-peer (P2P) communication. The wireless communication device 102 may generate a signal based on the data to be transmitted. The signal, when transmitted via an antenna, may cause variations in the electromagnetic field. The PC 104 may detect the variations in the electromagnetic field that may enable the PC 104 to receive the data transmitted by the wireless communication device 102. In various embodiments of the invention, the wireless communication device 102 may similarly receive signals within the NFC frequency band, via the antenna, by detecting variations in the electromagnetic field generated by the PC 104, for example.

In various embodiments of the invention, the wireless communication device 102 may also transmit signals within the FM frequency band. In this regard, the wireless communication device 102 may generate RF signals by modulating data on an FM carrier signal for which the frequency may be represented as $f_{TX}$. The RF signals may be transmitted via the same antenna utilized for transmitting and receiving NFC signals, as described above. The FM signals may be transmitted via the antenna simultaneously with the reception and/or transmission of NFC signals.

The wireless communication device 102 may similarly receive RF signals within the FM frequency band for which the frequency may be represented as $f_{RX}$. The RF signals may be received via the same antenna utilized for transmitting FM frequency band signals. In various embodiments of the invention, the FM signals may be received via the antenna simultaneously with the reception and/or transmission of NFC signals. For frequencies $f_{RX} \neq f_{TX}$, FM signals may be received via the antenna at the frequency $f_{RX}$ simultaneously with the transmission of FM signals via the antenna at the frequency $f_{TX}$.

Figure 2:
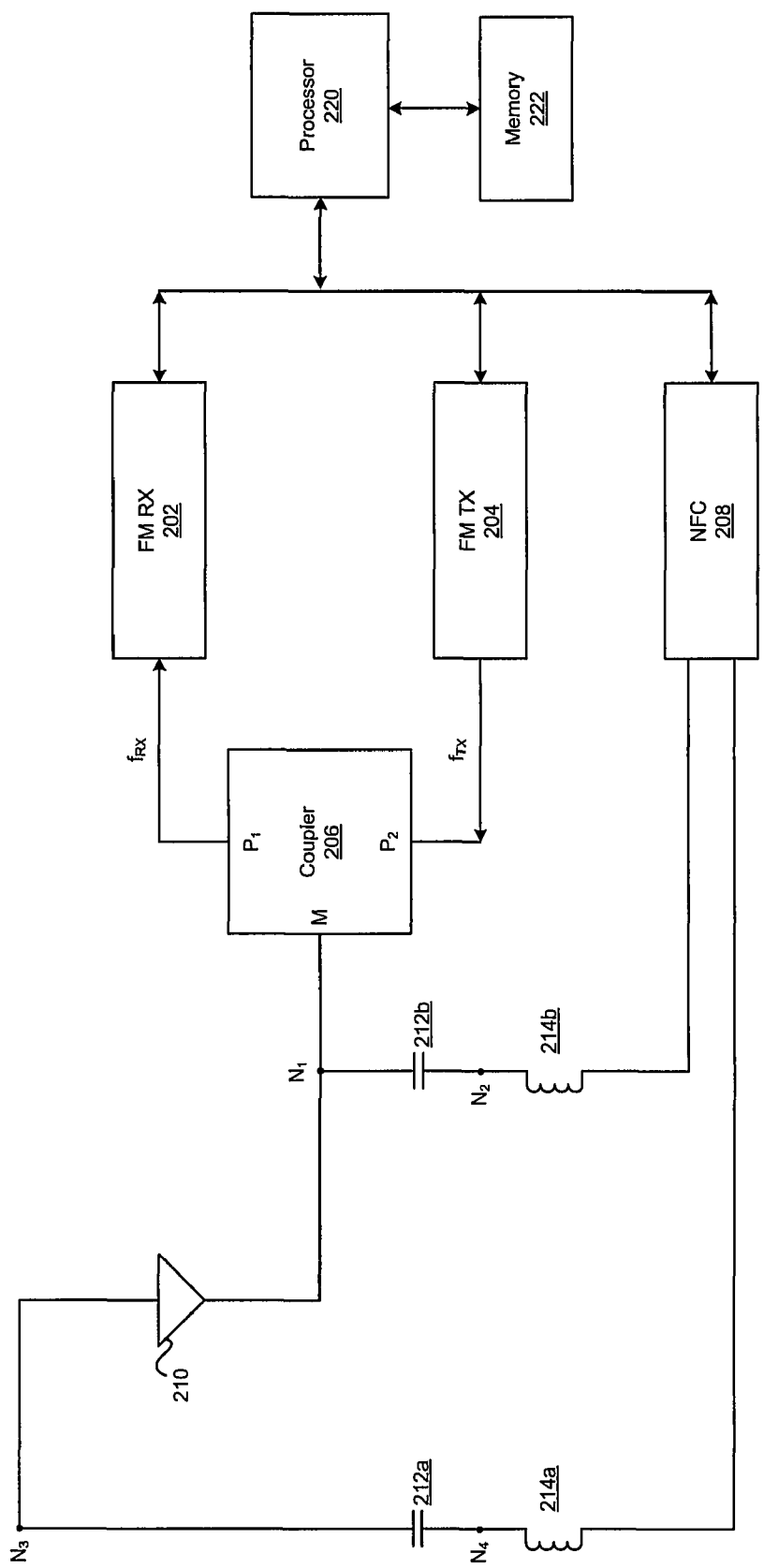
FIG. 2 is a block diagram illustrating an exemplary system for FM transmission, FM reception and near field communication (NFC) with a single antenna, in accordance with an embodiment of the invention.

FIG. 2 is a block diagram illustrating an exemplary system for FM transmission, FM reception and near field communication (NFC) with a single antenna, in accordance with an embodiment of the invention. Referring to FIG. 2, there is shown an FM RX 202, an FM TX 204 a coupler 206 an NFC transceiver 208, a processor 220, an antenna 210, capacitors 212a and 212b and inductors 214a and 214b.

The FM RX 202 may comprise suitable logic, circuitry and/or code that may enable the reception of modulated RF signals, for which the FM frequency band carrier frequency may be $f_{RX}$, and generation of decoded, or raw binary data contained within the received RF signals. The FM RX 202 may perform tasks that include the downconversion of the received RF signal to generate a baseband signal, the demodulation of data symbols contained within the baseband signal, based on a modulation type (for example, eight level phase shift keying (8-PSK)), to derive encoded data bits and decoding of the encoded decoded bits to derive the raw binary data.

The FM TX 204 may comprise suitable logic, circuitry and/or code that may enable the reception of raw binary data and the generation of modulated RF signals, for which the FM frequency band carrier frequency may be $f_{TX}$. The FM TX 204 may perform tasks that include the encoding of raw binary data to generate encoded binary data, the modulation of groups of encoded data bits, based on a modulation type, to generate a baseband signal comprising data symbols, and upconversion of the baseband signal, for which the FM frequency band carrier frequency may be $f_{TX}$, to generate the RF signal.

The coupler 206 may comprise suitable logic, circuitry and/or code that may enable the selective coupling of signal energy from a main line (M) to either a first port ($P_1$) or a second port ($P_2$). In various embodiments of the invention, the coupler 206 may comprise a bidirectional coupler, which also enable the selective coupling of signal energy from port $P_1$ and/or port $P_2$, and the main line M. The signal energy may be represented by a power level and frequency. In an exemplary embodiment of the invention, the coupler 206 may enable coupling of signal energy between M and $P_1$ when the signal frequency is $f_{RX}$. The coupler 206 may block the coupling of signal energy between M and $P_1$ when the signal frequency is $f_{TX}$. Furthermore, the coupler 206 may enable coupling of signal energy between M and $P_2$ when the signal frequency is $f_{TX}$. The coupler 206 may block the coupling of signal energy between M and $P_2$ when the signal frequency is $f_{RX}$.

The NFC transceiver 208 may comprise suitable logic, circuitry and/or code that may enable the reception of NFC signals, for which the carrier frequency of the received signal may be in the NFC frequency band. Data may be modulated in the received NFC signal. The NFC transceiver 208 may detect the NFC signal by detecting variations in the magnitude and/or direction of an electromagnetic field. The NFC transceiver 208 may perform tasks that include the downconversion of the received NFC signal to generate a baseband signal, the demodulation of data symbols contained within the baseband signal, based on a modulation type, to derive encoded data bits and decoding of the encoded decoded bits to derive the raw binary data.

The NFC transceiver 208 may also comprise suitable logic, circuitry and/or code that may enable the reception of raw binary data and the generation of modulated NFC signals. The NFC transceiver 208 may perform tasks that include the encoding of raw binary data to generate encoded binary data, the modulation of groups of encoded data bits, based on a modulation type, to generate a baseband signal comprising data symbols, and the upconversion of the baseband signal to generate the NFC signal.

The antenna 210 may enable simultaneous reception and/or transmission of NFC and FM signals. In an exemplary embodiment of the invention, the antenna 210 may comprise a serpentine wire.

The capacitor 212a and inductor 214a may form a filter circuit, for example, a bandpass filter. The characteristics of the filter circuit may be such that the impedance may approximate a short circuit when the frequency of a received signal is within the NFC frequency band, and may approximate an open circuit, or high impedance level, when the frequency of the received signal is not within the NFC frequency band. The capacitor 212b and inductor 214b may form a circuit, which is substantially similar to the circuit formed by the capacitor 212a and inductor 214a.

The processor 220 may generate control signals that enable a communication device, such as a wireless communication device 102, to utilize a single antenna to transmit or receive NFC signals while simultaneously transmitting and/or receiving FM signals. The processor 220 may execute code that may enable the generation of data to be transmitted in signals. The processor 220 may also execute code that may enable the processing of data from received signals. The processor 220 may also execute code that enables the selection of modulation types for FM and NFC signal reception. The processor 220 may also enable the selection of carrier frequencies for FM transmission and/or FM reception.

The memory 222 may comprise suitable logic, circuitry, and/or code that may be utilized to store, or write, and/or retrieve, or read, information, data, and/or executable code. The memory 222 may enable storage and/or retrieval of data that may be utilized transmission or reception of NFC signals and for simultaneous reception and/or transmission of FM signals. The memory 222 may comprise a plurality of random access memory (RAM) technologies such as, for example, DRAM, and/or nonvolatile memory, for example electrically erasable programmable read only memory (EEPROM).

In operation, with reference to FIG. 2, the antenna 210 may be coupled to the nodes $N_1$ and $N_3$. The main line of the coupler 206 and one terminal of the capacitor 212b may also be coupled to the node $N_1$. The other terminal of the capacitor 212b and one terminal of the inductor 214b may be coupled to the node $N_2$. The other terminal of the inductor 214b may be coupled to the NFC transceiver 208. One terminal of the capacitor 212a may also be coupled to the node $N_3$. The other terminal of the capacitor 212a and one terminal of the inductor 214a may be coupled to the node $N_4$. The other terminal of the inductor 214a may be coupled to the NFC transceiver 208.

When a signal is received via the antenna 210 for which the carrier frequency is within the NFC frequency band, the impedance of the capacitor 212a and inductor 214a circuit may approximate a short circuit. Similarly, the impedance of the capacitor 212b and inductor 214b circuit may also approximate a short circuit. As a result, the NFC signal received via the antenna 210 may be coupled to the NFC transceiver 208. The coupler 206 may detect the received NFC signal via the main line M, but may block the coupling of signal energy from line M to either port $P_1$ or $P_2$. Consequently, neither the FM RX 202 nor the FM TX 204 may receive signal energy from the received NFC signal.

When a signal is generated by the NFC transceiver 208 for which the carrier frequency is within the NFC frequency band, the signal may be coupled to the antenna 210, which may enable the transmission of the NFC signal via a wireless communication medium. The coupler 206 may detect the transmitted NFC signal via the main line M, but may block the coupling of signal energy from line M to either port $P_1$ or $P_2$. Consequently, neither the FM RX 202 nor the FM TX 204 may receive signal energy from the transmitted NFC signal.

When an FM signal is received via the antenna 210 (for which the carrier frequency, $f_{RX}$, is within the FM frequency range), the coupler 206 may couple the signal energy from the received FM signal to the port $P_1$, but may block the coupling of signal energy from the received FM signal to the port $P_2$. The impedance of the capacitor 212a and inductor 214a circuit may approximate an open circuit, and the impedance of the capacitor 212b and inductor 214b circuit may also approximate an open circuit. Consequently, the FM RX 202 may receive the received FM signal while neither the FM TX 204 nor NFC 208 may receive signal energy from the received FM signal.

When an FM signal is generated by the FM TX 204 (for which the carrier frequency, $f_{TX}$, is within the FM frequency range), the coupler 206 may detect the signal at the port $P_2$. The signal energy from the port $P_2$ may be coupled to the line M, and transmitted via the antenna 210. The coupler 206 may block the coupling of signal energy from the port $P_2$ to the port $P_1$. The impedance of the capacitor 212a and inductor 214a circuit may approximate an open circuit, and the impedance of the capacitor 212b and inductor 214b circuit may also approximate an open circuit. Consequently, the FM TX 204 may transmit an FM signal via the antenna 210 while neither the FM RX 202 nor NFC 208 may receive signal energy from the transmitted FM signal.

Based on the foregoing, in various embodiments of the invention at any given time instant the FM RX 202 may receive signals simultaneously while the FM TX 204 transmits signals. The FM RX 202 and FM TX 204 may simultaneously receive and transmit signals while the NFC transceiver 208 receives or transmits signals.

Figure 3:
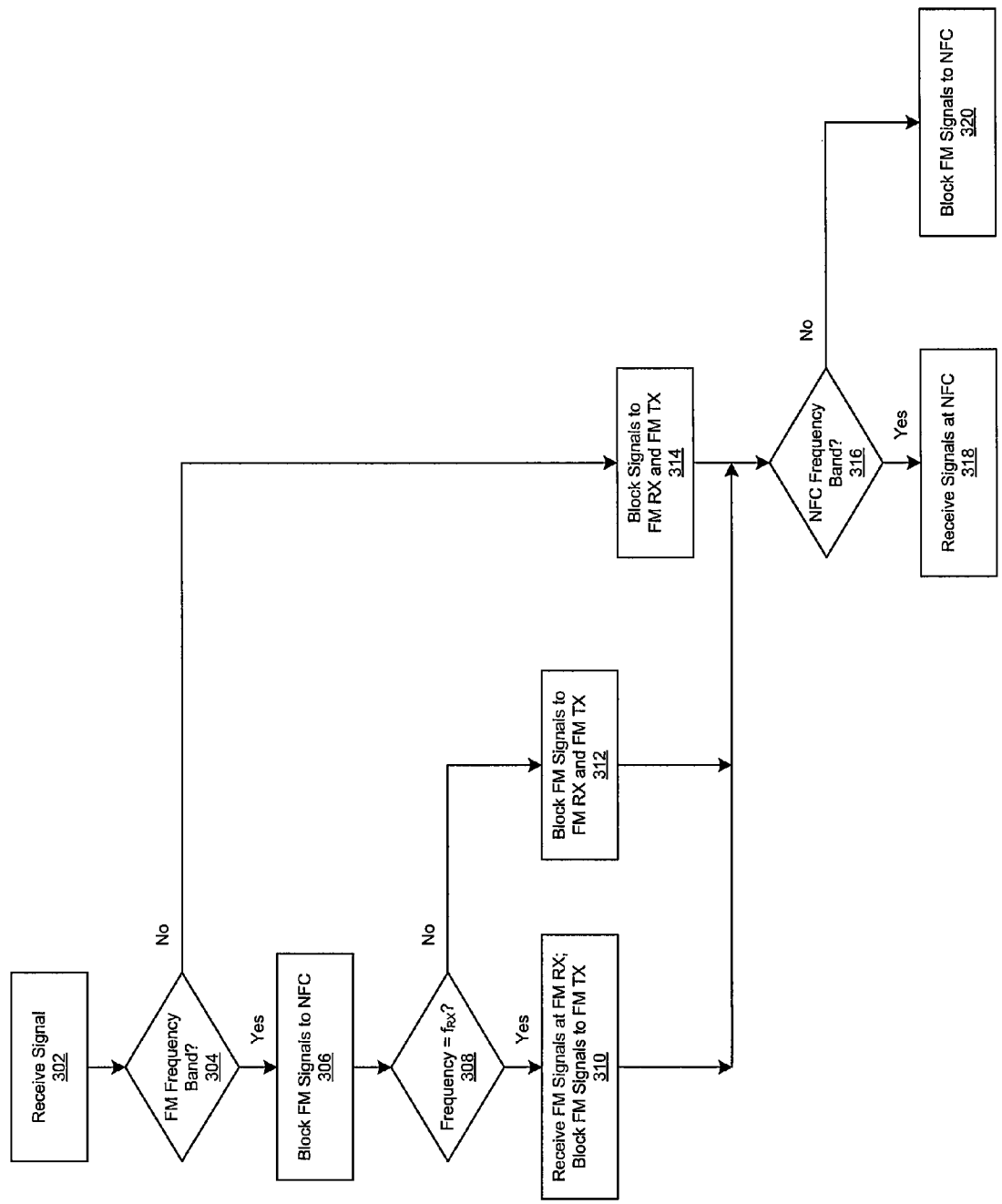
FIG. 3 is a flow chart illustrating exemplary steps for simultaneous reception of FM and NFC signals via a single antenna, in accordance with an embodiment of the invention.

FIG. 3 is a flow chart illustrating exemplary steps for simultaneous reception of FM and NFC signals via a single antenna, in accordance with an embodiment of the invention. Referring to FIG. 3, in step 302, the antenna 210 may receive at least one signal. Step 304 may determine whether the carrier frequency of one of the received signals is within the FM frequency band. If so, in step 306, the NFC transceiver 208 may be blocked from receiving signal energy from the received FM signal. Step 308 may determine whether the frequency of the received signal is $f_{RX}$. If so, in step 310, the FM RX 202 may receive signal energy from the received FM signal via the coupler 206, while the FM TX 204 may be blocked from receiving signal energy. If a determination is made in step 308 that the carrier frequency of the received FM signal is not approximately equal to $f_{RX}$, then in step 312 the coupler 206 may block the FM RX 202 and the FM TX 204 from receiving signal energy from the received FM signal. Alternatively, the FM RX 202 may receive the FM signal and filter out the received FM signal during signal processing.

If a determination is made in step 304 that the carrier frequency of the received signal is not within the FM frequency band, then in step 314, the coupler 206 may block the FM RX 202 and FM TX 204 from receiving signal energy from the received signal. Step 316 may follow either step 310, 312 or 314.

Step 316 may determine whether the carrier frequency of one of the received signals in step 302 is within the NFC frequency band. If so, the NFC transceiver 208 may receive signal energy from the received NFC signal. If not, the NFC transceiver 208 may be blocked from receiving signal energy from the received signal.

Figure 4:
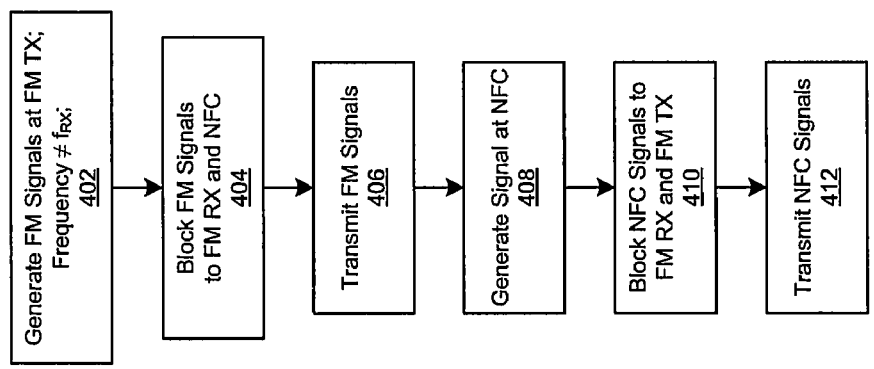
FIG. 4 is a flow chart illustrating exemplary steps for simultaneous transmission of FM and NFC signals via a single antenna, in accordance with an embodiment of the invention.

FIG. 4 is a flow chart illustrating exemplary steps for simultaneous transmission of FM and NFC signals via a single antenna, in accordance with an embodiment of the invention. Referring to FIG. 4, in step 402, the FM TX 204 may generate FM signals. The carrier frequency for the generated FM signal may be $f_{TX} \neq f_{RX}$. The coupler 206 may detect signal energy from the FM TX 204 at port $P_2$. In step 404, the coupler 206 may block the FM RX 202 from receiving signal energy detected at the port $P_2$. The coupler 206 may couple the signal energy detected at the port $P_2$ to the line M. The coupler 206 may couple the signal energy from the line M to the node $N_1$. The capacitors 212a and 212b and inductors 214a and 214b may block the NFC transceiver 208 from receiving signal energy from the node $N_1$ and/or from the node $N_3$. In step 406, the antenna 210 may transmit the signal detected at the node $N_1$.

In step 408, the NFC transceiver 208 may generate NFC signals. In step 410, the coupler 206 may block the FM RX 202 and FM TX 204 from receiving signal energy from the NFC signal detected at the node $N_1$. The capacitors 212a and 212b and inductors 214a and 214b may enable signal energy from the generated NFC signal to be coupled to the nodes $N_1$ and $N_3$. In step 412, the antenna 210 may transmit the NFC signal detected at the nodes $N_1$ and $N_3$.

In various embodiments of the invention, the steps 408-412 may be performed followed by the steps 402-406, or the steps may be performed simultaneously.

In various embodiments of the invention one or more circuits may enable, via a single antenna 210, simultaneous transmission of an FM signal at an FM TX 204 and reception of an FM signal at an FM RX 202, in addition to transmission or reception of NFC signals at an NFC transceiver 208. One or more filter circuits, comprising capacitors 212a and 212b and inductors 214a and 214b may enable blocking of at least a portion of signal energy from the transmitted FM signal from being received by the NFC transceiver 208. The filter circuit(s) may enable transfer of at least a portion of signal energy from the received NFC signal to the NFC transceiver 208. The NFC transceiver 208 may enable generation of an NFC signal. The filter circuit(s) may enable transfer of at least a portion of signal energy from the generated NFC signal to the single antenna 210, which may transmit the NFC signal. A coupler 206 may block signal energy from the received FM signal, and from the transmitted or received NFC signals from being received by an FM TX 204. The FM TX 204 may generate an FM signal. The coupler 206 may enable transfer of signal energy from the generated FM signal to the single antenna 210, which may transmit the FM signal. A coupler 206 may block signal energy from the transmitted FM signal, and from the transmitted or received NFC signals from being received by an FM RX 202. The coupler 206 may enable transfer of signal energy from the received FM signal to the FM RX 202.

Another embodiment of the invention may provide a machine-readable storage, having stored thereon, a computer program having at least one code section executable by a machine, thereby causing the machine to perform the steps as described herein for sharing a single antenna for frequency modulation (FM) transmit, FM receive and near field communication (NFC).

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for communicating information in a wireless communication system, the method comprising:
 for an antenna that enables concurrent communication of a plurality of signals including a near field communications (NFC) transmit signal, an NFC receive signal and a non-NFC signal:
  transmitting said NFC transmit signal or receiving said NFC receive signal via said antenna, while blocking at least a portion of said non-NFC signal being concurrently communicated via said antenna;
 wherein said non-NFC signal is a frequency modulation (FM) signal, and wherein said blocking comprising blocking at least a portion of a signal energy of a transmit FM signal and/or a receive FM signal, from being received by an NFC transceiver circuit that handles processing of said transmit NFC signal and said receive NFC signal.

2. The method according to claim 1, comprising transferring at least said portion of said signal energy from said receive NFC signal to said NFC transceiver circuit.

3. The method according to claim 1, comprising generating an NFC signal within said NFC transceiver circuit.

4. The method according to claim 3, comprising transferring at least said portion of said signal energy from said generated NFC signal to said antenna.

5. The method according to claim 4, comprising generating said transmitted NFC signal at said antenna based on said transferred at least said portion of said signal energy from said generated NFC signal.

6. A method for communicating information in a wireless communication system, the method comprising:
 for an antenna that enables concurrent communication of a plurality of signals including a near field communications (NFC) transmit signal, an NFC receive signal and a non-NFC signal:
  transmitting said NFC transmit signal or receiving said NFC receive Signal via said antenna, while blocking at least a portion of said non-NFC signal being concurrently communicated via said antenna;
 wherein said non-NFC signal is a frequency modulation (FM) signal, the method further comprising blocking at least a portion of a signal energy of a receive FM signal and/or said transmit NFC signal and/or said receive NFC signal, from being received by an FM transmitter circuit.

7. The method according to claim 6, comprising generating an FM transmit signal within said FM transmitter circuit.

8. The method according to claim 7, comprising transferring at least said portion of said signal energy from said generated FM signal to said antenna.

9. The method according to claim 8, comprising generating said transmit FM signal at said antenna based on said transferred at least said portion of said signal energy from said generated FM signal.

10. A method for communicating information in a wireless communication system, the method comprising:
 for an antenna that enables concurrent communication of a plurality of signals including a near field communications (NFC) transmit signal, an NFC receive signal and a non-NFC signal:
  transmitting said NFC transmit signal or receiving said NFC receive signal via said antenna, while blocking at least a portion of said non-NFC signal being concurrently communicated via said antenna;
 wherein said non-NFC signal is a frequency modulation (FM) signal, the method further comprising blocking at least a portion of signal energy of a transmit FM signal and/or said transmit NFC signal and/or said receive NFC signal, from being received by an FM receiver circuit.

11. The method according to claim 10, transferring at least a portion of a signal energy from said transmit FM signal to said antenna.

12. A system for communicating information in a wireless communication system, the system comprising:
 one or more circuits that enable, via an antenna, concurrent communication of a plurality of signals including a near field communications (NFC) transmit signal, an NFC receive signal and a non-NFC signal:

transmission of said NFC transmit signal or reception of said NFC receive signal via said antenna, while blocking at least a portion of said non-NFC signal being concurrently communicated via said antenna;

wherein said non-NFC signal is a frequency modulation (FM) signal, and wherein said one or more circuits enable blocking comprising blocking at least a portion of a signal energy of a transmit FM signal and/or a receive FM signal, from being received by an NFC transceiver circuit that handles processing of said transmit NFC signal and said receive NFC signal.

13. The system according to claim 12, wherein said one or more circuits enable transfer of at least said portion of said signal energy from said receive NFC signal to said NFC transceiver circuit.

14. The system according to claim 12, wherein said one or more circuits enable generation of an NFC signal within said NFC transceiver circuit.

15. The system according to claim 14, wherein said one or more circuits enable transfer of at least said portion of said signal energy from said generated NFC signal to said antenna.

16. The system according to claim 15, wherein said one or more circuits enable generation of said transmitted NFC signal at said antenna based on said transferred at least said portion of said signal energy from said generated NFC signal.

17. A system for communicating information in a wireless communication system, the system comprising:
one or more circuits that enable, via an antenna, concurrent communication of a plurality of signals including a near field communications (NFC) transmit signal, an NFC receive signal and a non-NFC signal:
transmission of said NFC transmit signal or reception of said NFC receive signal via said antenna, while blocking at least a portion of said non-NFC signal being concurrently communicated via said antenna;
wherein said non-NFC signal is a frequency modulation (FM) signal, and wherein said one or more circuits enable blocking of at least a portion of a signal energy of a receive FM signal and/or said transmit NFC signal and/or said receive NFC signal, from being received by an FM transmitter circuit.

18. The system according to claim 17, wherein said one or more circuits enable generation of an FM transmit signal within said FM transmitter circuit.

19. The system according to claim 18, wherein said one or more circuits enable transfer of at least said portion of said signal energy from said generated FM signal to said antenna.

20. The system according to claim 19, wherein said one or more circuits enable generation of said transmit FM signal at said antenna based on said transferred at least said portion of said signal energy from said generated FM signal.

21. A system for communicating information in a wireless communication system, the system comprising:
one or more circuits that enable, via an antenna, concurrent communication of a plurality of signals including a near field communications (NFC) transmit signal, an NFC receive signal and a non-NFC signal:
transmission of said NFC transmit signal or reception of said NFC receive signal via said antenna, while blocking at least a portion
wherein said non-NFC signal is a frequency modulation (FM) signal, and wherein said one or more circuits enable blocking of at least a portion of signal energy of a transmit FM signal and/or said transmit NFC signal and/or said receive NFC signal, from being received by an FM receiver circuit.

22. The system according to claim 21, wherein said one or more circuits enable transfer of at least a portion of a signal energy from said transmit FM signal to said antenna.

* * * * *